(12) United States Patent
Konno

(10) Patent No.: US 7,718,093 B2
(45) Date of Patent: *May 18, 2010

(54) ELECTROCONDUCTIVE THICK FILM COMPOSITION, ELECTRODE, AND SOLAR CELL FORMED THEREFROM

(75) Inventor: Takuya Konno, Tochigi-ken (JP)

(73) Assignee: E. I. du Pont de Nemours and Company, Wilmington, DE (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/037,306

(22) Filed: Feb. 26, 2008

(65) Prior Publication Data

US 2008/0178930 A1     Jul. 31, 2008

Related U.S. Application Data

(63) Continuation of application No. 11/106,261, filed on Apr. 14, 2005, now abandoned.

(51) Int. Cl.
*H01B 1/22* (2006.01)
(52) U.S. Cl. .................. 252/512; 252/514; 136/261
(58) Field of Classification Search ......... 252/512–514; 428/209, 210, 446; 136/261
See application file for complete search history.

(56) References Cited

U.S. PATENT DOCUMENTS

| | | | |
|---|---|---|---|
| 4,256,513 A | 3/1981 | Yoshida et al. | |
| 5,302,557 A | 4/1994 | Carroll et al. | |
| 5,795,501 A | 8/1998 | Kano et al. | |
| 7,138,347 B2 | 11/2006 | Konno et al. | |
| 7,485,244 B2 * | 2/2009 | Nakamura et al. | 252/512 |
| 7,494,607 B2 * | 2/2009 | Wang et al. | 252/514 |
| 2002/0096666 A1 | 7/2002 | Ichikawa et al. | |
| 2002/0187317 A1 | 12/2002 | Tsuyuki et al. | |
| 2005/0279970 A1 * | 12/2005 | Ogi et al. | 252/514 |
| 2006/0202173 A1 * | 9/2006 | Konno et al. | 252/512 |

FOREIGN PATENT DOCUMENTS

| | | |
|---|---|---|
| EP | 1008909 | 6/2000 |
| EP | 1400987 | 3/2004 |
| WO | 02082472 | 10/2002 |

* cited by examiner

*Primary Examiner*—Mark Kopec

(57) ABSTRACT

The electroconductive thick film paste of the present invention is a silver electroconductive paste, which includes silver particles, glass particles, and an organic vehicle, and is used in an electrode for connecting a back face terminal on the silicon substrate of a solar cell, and is characterized by the fact that the average particle diameter of said silver particles is 3.0-15.0 μm. The present invention is further directed to an electrode formed from the composition as detailed above and a solar cell comprising said electrode.

6 Claims, 2 Drawing Sheets

ELECTROCONDUCTIVE THICK FILM COMPOSITION, ELECTRODE, AND SOLAR CELL FORMED THEREFROM

This application is a CON of Ser. No. 11/106,261 (filed Apr. 14, 2005, now ABN).

FIELD OF THE INVENTION

The present invention is directed to a silicon semiconductor device. In particular, it pertains to an electroconductive composition used in the formation of a thick film electrode of a solar cell. The present invention is further directed to a silver electroconductive thick film composition (paste) for a solar cell.

TECHNICAL BACKGROUND OF THE INVENTION

The present invention can be applied to a broad range of semiconductor devices, although it is especially effective in light-receiving elements such as photodiodes and solar cells. The background of the invention is described below with reference to solar cells as a specific example of the prior art.

A conventional solar cell structure with a p-type base has a negative electrode that is typically on the front-side or sun side of the cell and a positive electrode on the backside. It is well-known that radiation of an appropriate wavelength falling on a p-n junction of a semiconductor body serves as a source of external energy to generate hole-electron pairs in that body. Because of the potential difference which exists at a p-n junction, holes and electrons move across the junction in opposite directions and thereby give rise to flow of an electric current that is capable of delivering power to an external circuit. Most solar cells are in the form of a silicon wafer that has been metallized, i.e., provided with metal contacts that are electrically conductive.

Most electric power-generating solar cells currently used on earth are silicon solar cells. Process flow in mass production is generally aimed at achieving maximum simplification and minimizing manufacturing costs. Electrodes in particular are made by using a method such as screen printing to form a metal paste.

An example of this method of production is described below in conjunction with FIG. 1. FIG. 1 shows a p-type silicon substrate, 10.

In FIG. 1($b$), an n-type diffusion layer, 20, of the reverse conductivity type is formed by the thermal diffusion of phosphorus (P) or the like. Phosphorus oxychloride ($POCl_3$) is commonly used as the phosphorus diffusion source. In the absence of any particular modification, the diffusion layer, 20, is formed over the entire surface of the silicon substrate, 10. This diffusion layer has a sheet resistivity on the order of several tens of ohms per square ($\Omega/\square$), and a thickness of about 0.3 to 0.5 µm.

After protecting one surface of this diffusion layer with a resist or the like, as shown in FIG. 1($c$), the diffusion layer, 20, is removed from most surfaces by etching so that it remains only on one main surface. The resist is then removed using an organic solvent or the like.

Next, a silicon nitride film, 30, is formed as an anti-reflection coating on the n-type diffusion layer, 20, to a thickness of about 700 to 900 Å in the manner shown in FIG. 1($d$) by a process such as plasma chemical vapor deposition (CVD).

As shown in FIG. 1($e$), a silver paste, 500, for the front electrode is screen printed then dried over the silicon nitride film, 30. In addition, a backside silver or silver/aluminum paste, 70, and an aluminum paste, 60, are then screen printed and successively dried on the backside of the substrate. Firing is then typically carried out in an infrared furnace at a temperature range of approximately 700 to 975° C. for a period of from several minutes to several tens of minutes.

Consequently, as shown in FIG. 1($f$), aluminum diffuses from the aluminum paste into the silicon substrate, 10, as a dopant during firing, forming a p+ layer, 40, containing a high concentration of aluminum dopant. This layer is generally called the back surface field (BSF) layer, and helps to improve the energy conversion efficiency of the solar cell.

The aluminum paste is transformed by firing from a dried state, 60, to an aluminum back electrode, 61. The backside silver or silver/aluminum paste, 70, is fired at the same time, becoming a silver or silver/aluminum back electrode, 71. During firing, the boundary between the back side aluminum and the back side silver or silver/aluminum assumes an alloy state, and is connected electrically as well. The aluminum electrode accounts for most areas of the back electrode, owing in part to the need to form a p+ layer, 40. Because soldering to an aluminum electrode is impossible, a silver back electrode is formed over portions of the back side as an electrode for interconnecting solar cells by means of copper ribbon or the like. In addition, the front electrode-forming silver paste, 500, sinters and penetrates through the silicon nitride film, 30, during firing, and is thereby able to electrically contact the n-type layer, 20. This type of process is generally called "fire through." This fired through state is apparent in layer 501 of FIG. 1($f$).

In the formation of the backside electrodes, there are two prior art methods which are typically used to form the Aluminum and silver electrodes (or Ag/Al electrode). The first method is disclosed in Japanese Kokai Patent Application Nos. 2001-127317 and 2004-146521 wherein a Ag paste is printed and dried, an Al paste is printed and dried, and both pastes are baked (to form the silver and Al electrodes).

The second method, as disclosed in Japanese Kokai Patent Application Hei 11[1999]-330512, is a process in which the formation sequence of the Al electrode and the Ag electrode of the first method is reversed wherein the paste for the Al electrode is printed and dried first, the Ag paste is printed and dried second, and both pastes are baked.

In the second method, cracks were apt to be generated in the superposed part of two electrodes due to the difference in the thermal contraction behavior of the Al electrode and the Ag electrode, so that the electrical characteristics (conversion efficiency, etc.) of the solar cell were degraded.

Japanese Kokai Patent Application No. 2003-223813 considers the thermal contraction of aluminum. In this publication, it is presented that the thermal contraction of Al is improved by including a material with a low thermal expansion coefficient, such as $SiO_2$ in the paste composition. However, in this publication, although the decrease of the characteristics of the solar cell is improved by the addition of $SiO_2$, it is not described that cracks of the superposed part of the Al electrode and the Ag electrode do not occur by the addition of $SiO_2$.

Additionally, when $SiO_2$ is used, there is a possibility that the solderability will be lowered, and the suppression of the thermal contraction and the solderability have a trade-off relationship. Usually, since the material of the second electrode used as an electrode for connection requires adhesive strength, as well as solderability, it must be designed so that glass particles used as a binder are necessarily included in the material to improve the adhesion with the Si substrate.

In the conventional electroconductive pastes, it was difficult to obtain an electroconductive paste for connection that suppresses the generation of cracks and that can form the second electrode having both a sufficient adhesive strength and that can maintain sufficient cell characteristics.

The present invention solves the above-mentioned problems by providing an electroconductive paste that essentially does not generate cracks in the superposed part, even by simultaneously baking an aluminum electrode and a silver electrode of the back face. This invention can form an electrode with a sufficient adhesive strength while still maintaining sufficient solar cell characteristics.

SUMMARY OF THE INVENTION

The electroconductive thick film paste of the present invention is a silver electroconductive paste, which includes silver particles, glass particles, and an organic vehicle, and is used in an electrode for connecting a back face terminal on the silicon substrate of a solar cell. This paste is characterized by the fact that the average particle diameter of said silver particles is 3.0-15.0 μm. The present invention is further directed to an electrode formed from the composition, as detailed above, and a solar cell comprising said electrode.

Figure 1A:
FIG. 1 is a process flow diagram illustrating the fabrication of a semiconductor device.
Figure 1B:
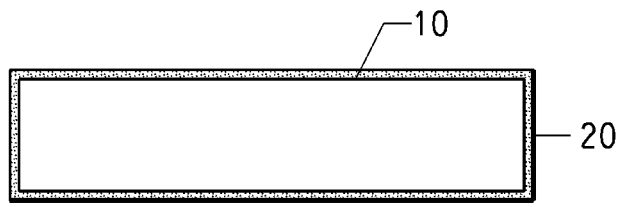
Figure 1C:
Figure 1D:
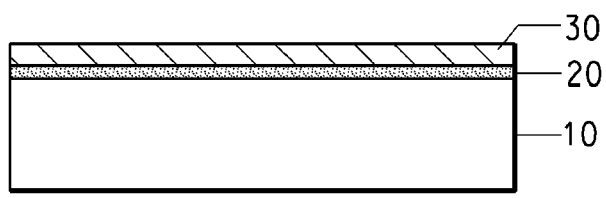
Figure 1E:
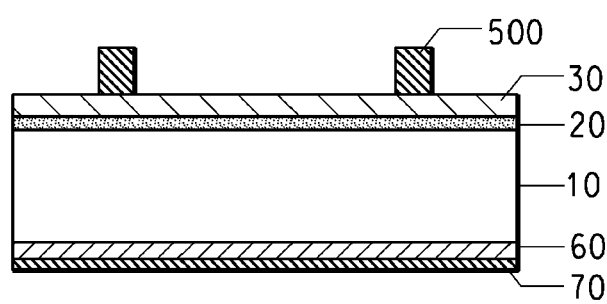
Figure 1F:
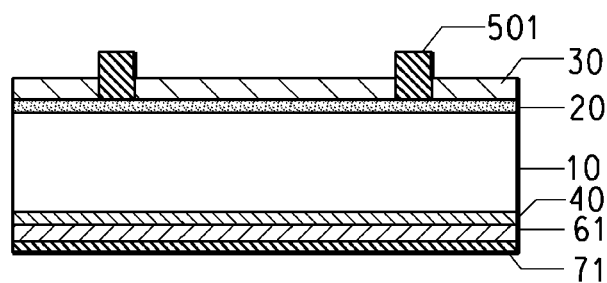

Reference numerals shown in FIG. 1 are explained below.

| | |
|---|---|
| 10: | p-type silicon substrate |
| 20: | n-type diffusion layer |
| 30: | silicon nitride film, titanium oxide film, or silicon oxide film |
| 40: | p + layer (back surface field, BSF) |
| 60: | aluminum paste formed on backside |
| 61: | aluminum back electrode (obtained by firing back side aluminum paste) |
| 70: | silver or silver/aluminum paste formed on backside |
| 71: | silver or silver/aluminum back electrode (obtained by firing back side silver paste) |
| 500: | silver paste formed on front side |
| 501: | silver front electrode (formed by firing front side silver paste) |

FIGS. 2 (a)-(d) explain the manufacturing processes for manufacturing a solar cell using the electroconductive paste of the present invention. Reference numerals shown in FIG. 2 are explained below.

| | |
|---|---|
| 102 | Silicon substrate |
| 104 | Light-receiving surface side electrode |
| 106 | Paste composition for a first electrode |
| 108 | Electroconductive paste for a second electrode |
| 110 | First electrode |
| 112 | Second electrode |

DETAILED DESCRIPTION OF THE INVENTION

The conductive thick film composition (paste) of the present invention provides the ability to form an electrode from said paste wherein the electrode essentially does not generate cracks in the overlapped part (back side Al, Ag electrodes), even when simultaneously baking an aluminum electrode and a silver electrode installed on the back face of a solar cell.

In order to achieve the above-mentioned objective, the present invention is a conductive thick film composition, in particular a silver electroconductive paste, which includes silver particles, glass particles, and an organic vehicle, and is used in an electrode for connecting a back face terminal on the silicon substrate of a solar cell. It is characterized by the fact that the average particle diameter of said silver particles is 3.0-15.0 μm. In the present invention, preferably, the silver particles are included at 40-93 wt % based on the total weight of the paste, the glass particles are included at 2-10 wt % based on the total weight of the paste, and the organic vehicle is included at 5-50 wt % based on the total weight of the paste. Furthermore, it is preferable for the glass powder included in the silver electroconductive paste to have a softening point of 450-550° C.

According to the present invention, a silver electroconductive paste is used for a second electrode, which suppresses the generation of cracks in the superposed part of the first electrode and second electrode, with the second electrode having a sufficient adhesive strength and does not degrade the characteristics of a solar cell.

The present invention pertains to a silver electroconductive paste that includes an electroconductive metal, especially silver particles, a binder, especially glass particles, and an organic vehicle, and is used in an electrode for connecting a back face terminal on the silicon substrate of a solar cell. The electroconductive paste of the present invention is used in the above-mentioned second method, that is, the method that prints and dries an electroconductive paste for the Al electrode, prints and dries an electroconductive paste for the silver electrode, and bakes them, in the formation of back electrodes of a solar cell.

Next, each component of the electroconductive thick film paste of the present invention is explained.

1. Electroconductive Metal

As the electroconductive metal usable in the electroconductive paste of the present invention, silver (Ag) particles can be mentioned and are most preferable. The silver particles are preferably the flake form or powder form. In the use as a general electroconductive paste, the particle diameter of the silver particles is not particularly limited in terms of technical effects; however, since the particle diameter has an influence on the sintering characteristic of the silver (for example, silver particles with a large particle diameter are sintered at a speed slower than that of the silver particles with a small particle diameter), it is preferable to have a specific diameter for the purpose of the present invention. Furthermore, it is also necessary for the silver particles to have a particle diameter suitable for a method for spreading the electroconductive paste (for example, screen printing).

In order to satisfy the above-mentioned requirements, the average particle diameter of the silver particles is 3.0-15.0 μm, preferably 5.0-11.0 μm. With the use of silver particles with such a particle diameter, the electroconductive paste is appropriately spread, the melting contraction behavior of the aluminum paste for the first electrode of the back face, and the sintering behavior of the silver electroconductive paste for the second electrode are matched, and the generation of cracks in the superposed part of two electrodes can be suppressed.

If the particle diameter of the silver particles is smaller than the above-mentioned range, the silver electroconductive paste exhibits a steep sintering behavior, and cracks are apt to be generated between the two electrodes due to the mismatch of the sintering speed with the aluminum paste. Also, if the particle diameter of the silver particles is greater than the above-mentioned range, since the sintering is not sufficiently advanced, the electrical conductivity is lowered, and the strength of the electrode film is decreased.

It is preferable for the silver to have a high purity (99+%); however, a substance with a low purity can also be used in response to the electrical demand of the electrode pattern.

In the present invention, the electroconductive metal is most preferably the silver particles as mentioned above; however, an electroconductive metal other than silver can also be used. Metals such as Cu, Au, Ag, Pd, and Pd may be useful. Additionally, alloys and mixtures of the preceding metals are also useful in the present invention. For example, Cu, Au, Ag—Pd, Pt—Au, etc., can be used. It is understood that the preceding discussion regarding the use of silver particles is not limiting and applies to the use of the other metals, alloys and mixtures detailed above.

The content of the electroconductive metal is not particularly limited as long as it is an amount that can achieve the objective of the present invention; however, the silver particles are preferably present at 40-93 wt % based on the weight of the electroconductive paste. Furthermore, aluminum may be added to the composition to enhance desired properties.

2. Inorganic Binder

It is preferable for the electroconductive paste of the present invention to include an inorganic binder. The inorganic binder usable in the present invention is a glass frit with a softening point of 450-550° C. so that the electroconductive paste can be baked at 600-800° C., appropriately sintered and moistened, and appropriately adhered to a silicon substrate. If the softening point is lower than 450° C., the sintering is excessive, and the effects of the present invention sometimes cannot be sufficiently obtained. On the other hand, if the softening point is higher than 550° C., since a sufficient melt flow is not caused during the baking, a sufficient adhesive strength is not exerted, and the liquid-phase sintering of the silver sometimes cannot be promoted.

Here, the "softening point" is that obtained by the fiber elongation method of ASTM C338-57.

Since the chemical composition of the glass frit is not important in the present invention, any glass frit used in electroconductive pastes for electronic material can be applied. For example, lead borosilicate glass, etc., can be appropriately used. Lead silicate glass and lead borosilicate glass are excellent materials in the present invention in terms of both the softening point range and the glass fusibility. A leadless glass such as zinc borosilicate can also be used.

The content of the glass frit as the inorganic binder is not particularly limited as long as it is an amount that can achieve the objective of the present invention; however, the content is 2.0-10.0 wt %, preferably 3.0-6.0 wt %, based on the total weight of the electroconductive paste.

If the amount of the inorganic binder is smaller than 2.0 wt %, the adhesive strength is sometimes insufficient, and if the amount of the inorganic binder is more than 10.0 wt %, soldering as a postprocess is sometimes hindered by glass floating, etc.

3. Organic Vehicle

The electroconductive paste of the present invention includes an organic vehicle. In the present invention, an optional inactive liquid can be used as the organic vehicle. As usable organic liquids, for example, alcohols; esters of alcohols (such as an acetate or propionate); starch (such as pine oil and terpineol); various solutions such as a pine oil solution or ethylene glycol monobutyl ether monoacetate solution of a resin (polymethacrylate, etc.) or ethylcellulose, or a terpineol solution of ethylcellulose can be mentioned. In the present invention, the terpineol solution of ethylcellulose (ethyl cellulose content=5-50 wt %) is preferably used.

The content of the organic vehicle is 5-50 wt % based on the total weight of the electroconductive paste.

4. Additives

In the electroconductive paste of the present invention, a thickener and/or a stabilizer and/or other general additives may or may not be used. When additives are used, a tackifier (thickener), stabilizer, etc., can be added, or as other general additives, a dispersant, viscosity adjustor, etc., can also be used. The amount of additives is used determined in accordance with the characteristics of the electroconductive paste that is finally obtained. The amount of additives can be appropriately determined by the manufacturer concerned. Also, several kinds of additives may be used.

As will be explained below, it is preferable for the electroconductive paste of the present invention to have a viscosity in a prescribed range. In order to give an appropriate viscosity to the electroconductive paste, if necessary, a tackifier (thickener) can be added. As an example of the tackifier, for example, the above-mentioned substances can be mentioned. The amount of tackifier, etc., being added varies in accordance with the viscosity of the final electroconductive paste; however, it can be appropriately determined by the manufacturer concerned.

The electroconductive paste of the present invention is conveniently manufactured by mixing each of the above-mentioned components by a three-roll kneader. The electroconductive paste of the present invention is preferably spread on the desired part of the back face of a solar cell by screen printing; in spreading by such a method, it is preferable to have a viscosity in a prescribed range. The viscosity of the electroconductive paste of the present invention is preferably 50-300 PaS when it is measured at 10 rpm and 25° C. by a utility cup using a Brookfield HBT viscometer and #14 spindle.

The electroconductive paste of the present invention is used for the second electrode formed in a partially superposed state with the first electrode formed from an electroconductive paste mainly composed of aluminum. In other words, the electroconductive paste of the present invention is formed by printing and drying an electroconductive paste for the Al electrode, printing and drying an electroconductive paste for the silver electrode, and simultaneously baking them, and is used for an electrode to connect an electrode on the back face. Next, an example in which a solar cell is prepared using the electroconductive paste (silver electroconductive paste) of the present invention is explained, referring to the figure (FIG. 2).

First, a Si substrate 102 is prepared. On the light-receiving side face (surface) of the Si substrate, electrodes (for example, electrodes mainly composed of Ag) 104 are installed (FIG. 2(a)). On the back face of the substrate, aluminum pastes used as a back face electrode for a solar cell (although it is not particularly limited as long as it is used for a solar cell, for example, PV333, PV322 (commercially available from E. I. du Pont de Nemours and Company)) 106 are spread by screen printing, etc., then dried (FIG. 2(b)). The electroconductive paste of the present invention is then spread in a partially overlapped state with the aluminum paste, printed and dried in advance, and dried (FIG. 2(c)). The drying temperature of each paste is preferably 180° C. or lower. Also, as the film thickness of each electrode of the backface, the aluminum paste preferably has a dried film thickness of 40-60 μm, and the thickness of the silver electroconductive paste of the present invention is preferably 20-30 μm. Also, the overlapped part of the aluminum paste and the silver electroconductive paste is preferably about 0.5-2.5 mm.

Figure 2A:
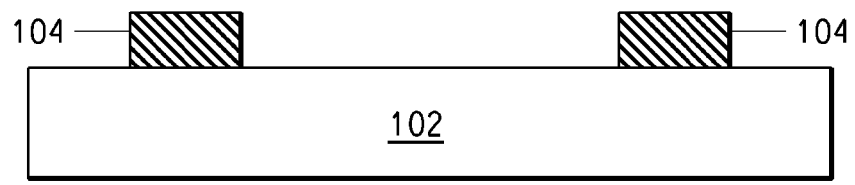
Figure 2B:
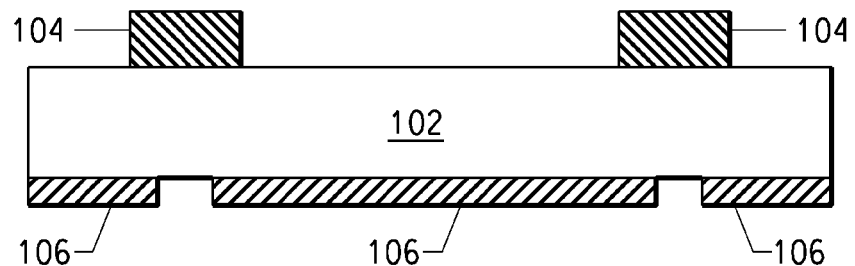
Figure 2C:
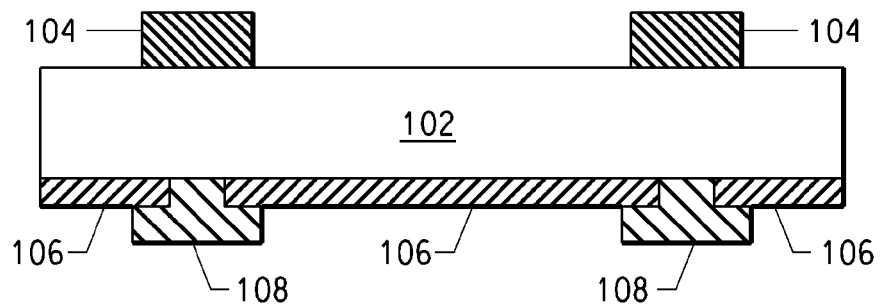
Figure 2D:
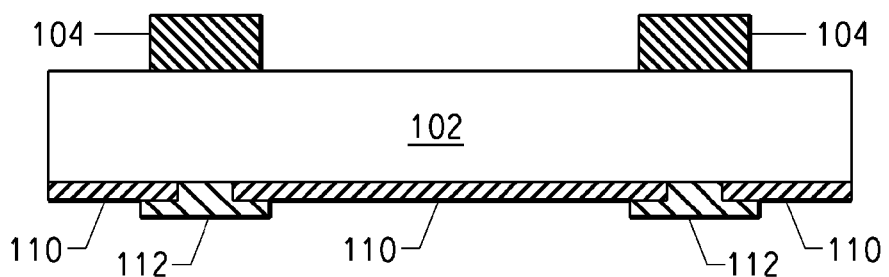

Next, the substrate obtained is baked at a temperature of 600-900° C. for about 2-15, for instance, so that the desired solar cell is obtained (FIG. 2(d)).

The solar cell obtained using the electroconductive paste of the present invention, as shown in FIG. 2(d), has electrodes 104 on the light-receiving face (surface) of the substrate (for example, Si substrate) 102, Al electrodes (first electrodes) 110 mainly composed of Al and silver electrodes (second electrodes) 112 mainly composed of Ag, on the back face.

EXAMPLES

Next, the present invention is explained in further detail by an application example. In the following application example, a manufacturing example of the silver electroconductive paste of the present invention and an example in which the silver electroconductive paste is used as an electrode material for the back face of a Si substrate in manufacturing a solar cell are explained.

Application Example 1

Application Example 1 is detailed below.

Manufacture of Electroconductive Paste 1.7 wt % of a viscosity adjustor and 22.5 wt % of an organic vehicle (terpineol solution of ethylcellulose (containing 20 parts ethylcellulose)) were added to a mixture of 4.8 wt % glass frit (Si—B—Pb—O system) and 71.0 wt % silver powder with an average particle diameter of 8.5 μm. This mixture was premixed by a universal mixer and kneaded by a three-roll kneader, so that a silver electroconductive paste was obtained. The particle diameter, content, and characteristics of the materials used are shown in FIG. 2.

Manufacture of Solar Cell

Using the silver electroconductive paste obtained, a solar cell was formed in the following sequence.

(1) On the back face of a Si substrate having a silver electrode on the surface, an aluminum paste PV333 for the back face electrode of a solar cell (commercially available from E. I. du Pont de Nemours and Company) was screen-printed at a dried film thickness of 40-60 μm and dried at a temperature of 180° C. or lower. After drying the silver electroconductive paste of the present invention, a film thickness of 20-30 μm was obtained; the silver paste was screen-printed so that it overlapped the above-mentioned aluminum paste by a width of 1 mm, and dried.

(2) The aluminum paste and the silver electroconductive paste were simultaneously baked at a heater temperature of 800° C. for a baking time of 10 min in an infrared baking furnace.

Evaluation

The overlapped part of the back face electrode of the baked product obtained was enlarged at a magnification of 100 times and observed by a microscope (digital microscope); the existence of cracks was observed with the naked eye.

In addition to the observation of cracks, the adhesive strength of the second electrode was measured. As its measuring method, the adhesive strength was measured at a tensile speed of 2 inches (5.08 cm) per min using an "Instron" tensile tester with a peeling-off angle of 90°.

Furthermore, the other characteristics required of the solar cell, including the conversion coefficient, were decided.

These results were shown in Table II.

Comparative Examples 1-3

Electroconductive pastes with mixture compositions and characteristics as shown in Table I were used instead of the electroconductive paste of the present invention explained in Application Example 1; and solar cells were manufactured by a sequence similar to that shown in Application Example 1. Also, Comparative Example 1 corresponds to a conventional electroconductive paste.

The solar cells obtained were evaluated similarly to Application Example 1. The results are shown in Table II.

TABLE I

|  |  |  | Application Example 1 | Comparative Example 1 (conventional example) | Comparative Example 2 | Comparative Example 3 |
|---|---|---|---|---|---|---|
| Silver particles | Average particle diameter | μm | 8.5 | 2.5 | 8.5 | 8.5 |
|  | Content | wt % | 71.0 | 71.0 | 71.0 | 71.0 |
| Glass frit | Softening point | ° C. | 500.0 | 500.0 | 500.0 | 600.0 |
|  | Content | wt % | 4.8 | 2.5 | 1.0 | 4.8 |
| Organic vehicle |  | wt % | 22.5 | 25.0 | 26.5 | 22.5 |
| Viscosity adjustor |  | wt % | 1.7 | 1.5 | 1.5 | 1.7 |

TABLE II

|  | Application Example 1 | Comparative Example 1 (Conventional example) | Comparative Example 2 | Comparative Example 3 |
|---|---|---|---|---|
| Generation of cracks [1] | OK | NG | OK | OK |
| Adhesive strength (N) | 2.2 | 2.7 | 0.7 | 0.3 |
| Characteristics of solar cell [2] | OK | NG | OK | OK |

[1] As for the generation of cracks, when cracks were essentially not generated (no cracks were generated, or even if few cracks were generated, they had no influence on the characteristics), it was decided as OK; when cracks were generated, it was decided as NG.

[2] The characteristics required for solar cells including the conversion coefficient were decided. When sufficient practical characteristics were obtained, it was decided as OK, and when impractical characteristics were obtained, it was decided as NG.

According to Application Example 1, in the solar cell using the silver electroconductive paste of the present invention, there was essentially no generation of cracks, and the adhesive characteristic and the characteristics of the solar cell were maintained (sufficiently practical). On the contrary, in Comparative Example 1 (conventional example), since the particle diameter of the silver particles was smaller than that of the silver electroconductive paste of the present invention, cracks were generated, and the characteristics of the solar cell were insufficient. Also, in Comparative Example 2, since the content of the glass frit was low, a sufficient adhesive strength could not be obtained. Furthermore, in Comparative Example 3, since the glass softening point was higher than that of the electroconductive paste of the present invention, a sufficient adhesive strength could not be obtained.

INDUSTRIAL APPLICABILITY

The electroconductive paste of the present invention can be utilized in the manufacture of a solar cell.

What is claimed is:

1. A backside electrode of a solar cell, comprising:
   (a) a solar cell substrate;
   (b) a first electrode formed on the solar cell substrate, wherein the first electrode comprises Al; and
   (c) a second electrode partially overlapping the first electrode, wherein the second electrode has been formed from a paste comprising:
      (i) 40-93 weight percent, based on the total weight of the paste, of metal particles selected from the group consisting of Cu, Au, Ag, Pd, Pt, alloys of Cu, alloys of Au, alloys of Ag, alloys of Pd, alloys of Pt, and mixtures thereof; said metal particles having an average particle diameter in the range of 3.0 to 15.0 µm;
      (ii) 2-10 weight percent, based on the total weight of the paste, of glass particles; the softening point of said glass particles being in the range of 450-550° C., and
      (iii) 5-50 weight percent, based on the total weight of the paste, of an organic vehicle.

2. The backside electrode of claim 1, wherein the paste for the second electrode comprises Ag.

3. The backside electrode of claim 1, wherein the paste for the second electrode further comprises Al.

4. A method of forming the backside electrode of claim 1 comprising:
   admixing
      (a) 40-93 wt% of metal particles selected from Cu, Au, Ag, Pd, Pt, alloys of Cu, Au, Ag, Pd, Pt, and mixtures thereof;
      (b) 2-10 wt% of glass particles; dispersed in
      (c) an organic vehicle; and firing (a), (b) and (c) to remove the organic vehicle and sinter said glass particles
         wherein the average particle diameter of said metal particles is in the range of 3.0 to 15.0 µm, and
         wherein said fired thick film conductive paste composition is used in the electrode for connecting a back face terminal on a silicon substrate of a solar cell.

5. The method of claim 4 wherein said thick film conductive composition further comprises aluminum.

6. A solar sell comprising the electrode of claim 4.

* * * * *